US010145011B2

(12) United States Patent
Abedijaberi et al.

(10) Patent No.: US 10,145,011 B2
(45) Date of Patent: Dec. 4, 2018

(54) SUBSTRATE PROCESSING SYSTEMS HAVING MULTIPLE GAS FLOW CONTROLLERS

(71) Applicant: SunEdison Semiconductor Limited (UEN201334164H), Singapore (SG)

(72) Inventors: Arash Abedijaberi, St. Charles, MO (US); John A. Pitney, St. Peters, MO (US); Shawn George Thomas, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 280 days.

(21) Appl. No.: 15/083,777

(22) Filed: Mar. 29, 2016

(65) Prior Publication Data

US 2016/0289830 A1 Oct. 6, 2016

Related U.S. Application Data

(60) Provisional application No. 62/139,969, filed on Mar. 30, 2015.

(51) Int. Cl.
*C23C 16/455* (2006.01)
*C23C 16/52* (2006.01)
(Continued)

(52) U.S. Cl.
CPC .. *C23C 16/45561* (2013.01); *C23C 16/45563* (2013.01); *C23C 16/52* (2013.01);
(Continued)

(58) Field of Classification Search
CPC ........ C23C 16/45561; C23C 16/45563; C23C 16/52; C23C 16/45587; C23C 16/455;
(Continued)

(56) References Cited

U.S. PATENT DOCUMENTS 4,381,213 A * 4/1983 Flowers .................. C30B 29/06
438/558
5,551,982 A * 9/1996 Anderson ............. C23C 16/455
118/715

(Continued)

FOREIGN PATENT DOCUMENTS

| JP | 2003086524 A | 3/2003 |
| JP | 2003115459 A | 4/2003 |
| WO | 2010053866 A2 | 5/2010 |
| WO | 2011077641 A1 | 6/2011 |

*Primary Examiner* — Laura Edwards
(74) *Attorney, Agent, or Firm* — Armstrong Teasdale LLP (57) ABSTRACT

A system for depositing a layer on a substrate includes a processing chamber including a gas inlet, a plurality of gas flow controllers connected in fluid communication with a gas supply source, a gas distribution plate disposed between the plurality of gas flow controllers and the gas inlet, and a gas injection cap connected in fluid communication between the plurality of gas flow controllers and the gas distribution plate. The gas distribution plate defines a plurality of holes, and the gas injection cap defines a plurality of gas flow passages, each extending from an inlet connected to one of the gas flow controllers to an outlet connected in fluid communication with at least one of the holes in the gas distribution plate. Each of the gas flow controllers is disposed proximate to the gas injection cap.

17 Claims, 11 Drawing Sheets

(51) Int. Cl.
*H01L 21/02* (2006.01)
*C30B 25/14* (2006.01)
*C30B 25/16* (2006.01)

(52) U.S. Cl.
CPC ............ *C30B 25/14* (2013.01); *C30B 25/165* (2013.01); *H01L 21/02532* (2013.01); *H01L 21/0262* (2013.01)

(58) Field of Classification Search
CPC ........ C23C 16/45517; C23C 16/45578; H01L 21/02532; H01L 21/0262; C30B 25/16; C30B 25/165
USPC ................. 118/715, 724; 156/345.33, 345.37
See application file for complete search history.

(56) References Cited

U.S. PATENT DOCUMENTS

| | | | |
|---|---|---|---|
| 6,444,037 B1* | 9/2002 | Frankel | C23C 16/401 |
| | | | 118/715 |
| 6,500,734 B2 | 12/2002 | Anderson et al. | |
| 6,896,764 B2* | 5/2005 | Kitazawa | C23C 16/4412 |
| | | | 118/715 |
| 8,088,223 B2 | 1/2012 | Todd et al. | |
| 2004/0050325 A1* | 3/2004 | Samoilov | C23C 16/45561 |
| | | | 118/715 |
| 2007/0281084 A1 | 12/2007 | Hirosawa et al. | |
| 2010/0116207 A1 | 5/2010 | Givens et al. | |
| 2010/0272892 A1 | 10/2010 | Kobayashi et al. | |
| 2012/0222751 A1* | 9/2012 | Okabe | C23C 16/45557 |
| | | | 137/14 |

* cited by examiner

SUBSTRATE PROCESSING SYSTEMS HAVING MULTIPLE GAS FLOW CONTROLLERS

CROSS-REFERENCE TO RELATED APPLICATIONS

This applications claims priority to U.S. Provisional Patent Application Ser. No. 62/139,969, filed on Mar. 30, 2015, the disclosure of which is hereby incorporated by reference in its entirety.

FIELD

The field relates generally to chemical vapor deposition systems for use in processing semiconductor wafers and, more specifically, to gas injection systems for controlling the uniformity of gas flow within a chemical vapor deposition process chamber.

BACKGROUND

In chemical vapor deposition (CVD) processes, such as silicon epitaxial growth processes, uniformity in the thickness of a deposited film on a substrate is dependent on, among other factors, uniformity in the flow distribution of gases within the process chamber. As the requirements for uniformity in film thickness become more stringent, the desire for more uniform flow rate distribution of gases in the process chamber increases.

Various attempts have been made to improve uniformity in gas flow distribution within CVD reactors, such as modifying the shape, size, or arrangement of static components (e.g., liners or baffle plates) within the CVD reactor. While such modifications may provide some improvements in gas flow distribution, known attempts to improve gas flow distribution generally have not provided a satisfactory ability to easily tune the gas flow distribution within the processing chamber.

Some known CVD reactors include multiple gas flow controllers that provide independent control of the gas flow rate through gas injection passages or channels. However, the construction of such known CVD reactors typically requires that the gas flow controllers be positioned relatively remote from the processing chamber. Consequently, there is a significant length of conduit or piping between the gas flow controllers and the inlet of the processing chamber, which reduces the precision with which gas flow rates can be controlled.

Accordingly, a need exists for a substrate processing system that improves the uniformity of gas flow distribution within the processing chamber and provides enhanced control over the gas flow rate of gases flowing into the processing chamber.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for depositing a layer on a substrate includes a processing chamber including a gas inlet disposed at an upstream end of the processing chamber, a plurality of gas flow controllers connected in fluid communication with a gas supply source, a gas distribution plate disposed between the plurality of gas flow controllers and the gas inlet, and a gas injection cap connected in fluid communication between the plurality of gas flow controllers and the gas distribution plate. The plurality of gas flow controllers includes at least three gas flow controllers. The gas distribution plate defines a plurality of holes, and the gas injection cap defines a plurality of gas flow passages, each extending from an inlet connected to one of the gas flow controllers to an outlet connected in fluid communication with at least one of the holes in the gas distribution plate. Each of the gas flow controllers is disposed proximate to the gas injection cap.

In another aspect, a system for depositing a layer on a substrate includes an external housing defining an interior, a processing chamber disposed within the interior and including a gas inlet disposed at an upstream end of the processing chamber, a plurality of gas flow controllers connected in fluid communication with a gas supply source, a gas distribution plate disposed between the plurality of gas flow controllers and the gas inlet, and a gas injection cap connected in fluid communication between the plurality of gas flow controllers and the gas distribution plate. The gas distribution plate defines a plurality of holes, and the gas injection cap defines a plurality of gas flow passages each extending from an inlet connected to one of the gas flow controllers to an outlet connected in fluid communication with at least one of the holes in the gas distribution plate. The plurality of gas flow controllers and the gas injection cap are enclosed within the interior of the external housing.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
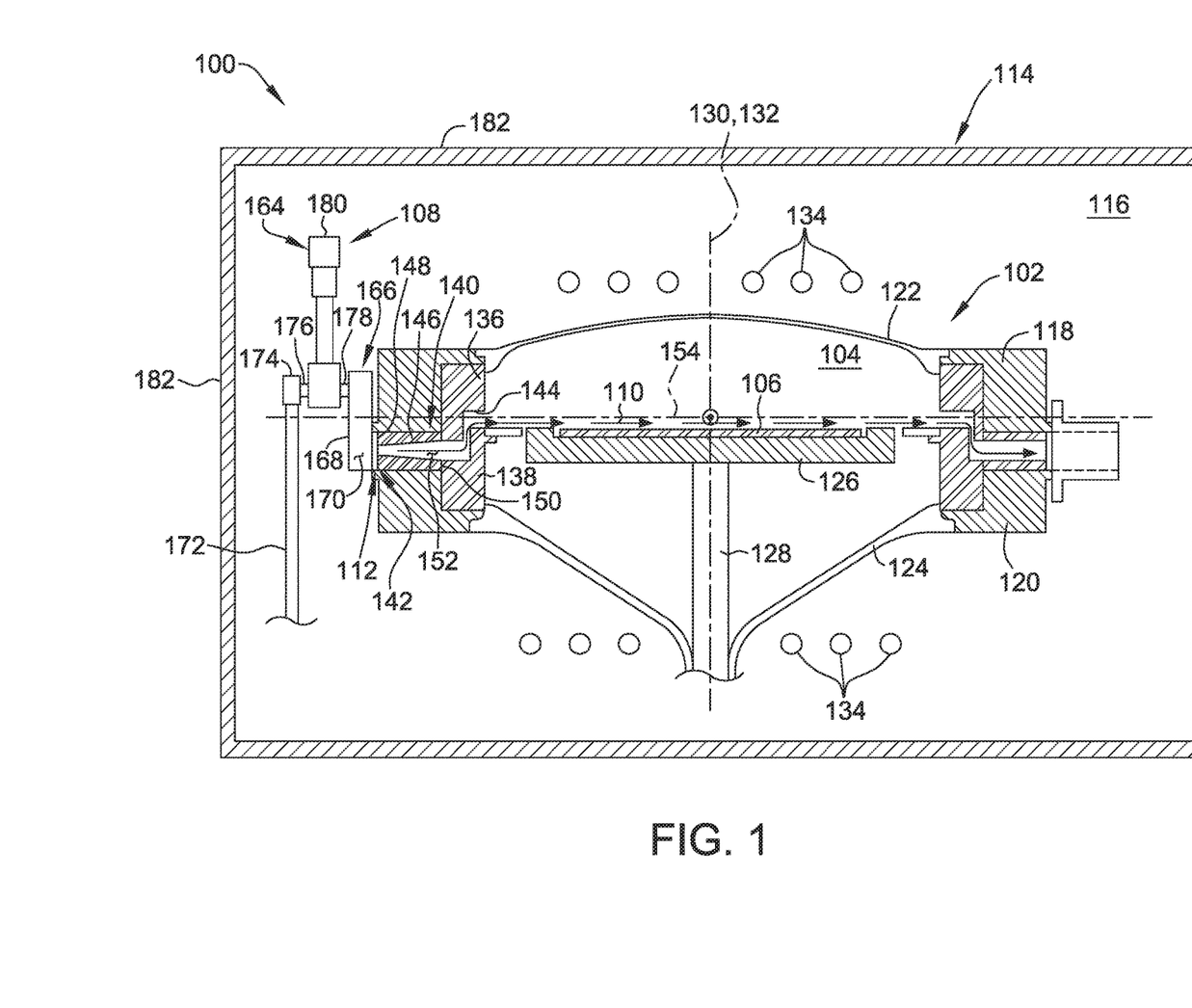
FIG. 1 is a partially schematic cross-section of a substrate processing system including an example gas injection system.

Referring to FIG. 1, a substrate processing system shown in the form of a chemical vapor deposition (CVD) system is indicated generally at 100 in FIG. 1. The illustrated system is a single substrate system, however, the systems disclosed herein for providing improved uniformity in gas flow distribution are suitable for use in other system designs including, for example, multiple substrate systems. One example of a CVD system suitable for use in accordance with the present disclosure is the Applied Materials EPI Centura 300.

Figure 2:
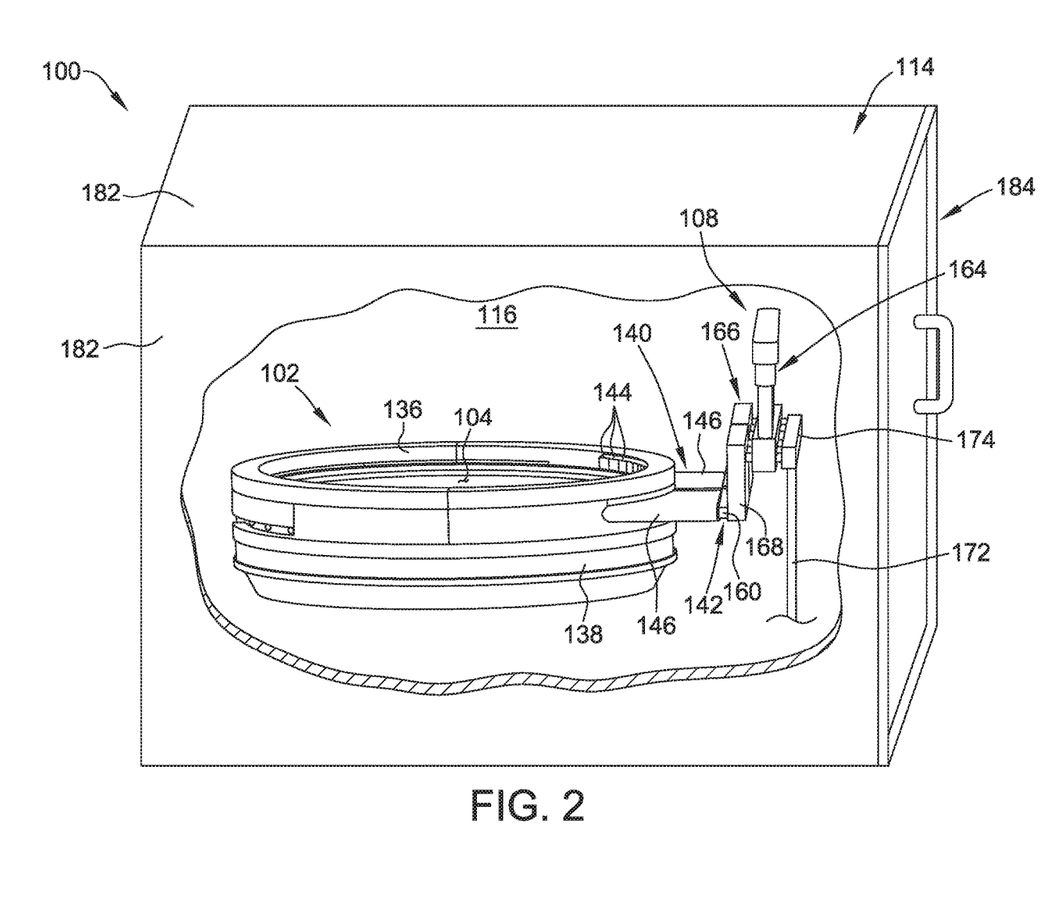
FIG. 2 is a perspective view of the substrate processing system of FIG. 1.

The CVD system 100 generally includes a CVD reactor 102 having a processing chamber 104 defined therein for depositing and/or growing thin films on a substrate 106, and a gas injection system 108 for introducing a process gas 110 into the processing chamber 104. As shown in FIG. 1, the gas injection system 108 is fluidly connected to the CVD reactor 102 at a gas injection port 112 disposed at an upstream end of the CVD reactor 102. As shown in FIGS. 1 and 2, the CVD system 100 also includes an external housing 114 defining an interior 116 within which the CVD reactor 102 and the gas injection system 108 are enclosed.

In the illustrated embodiment, the CVD reactor 102 includes an upper chamber wall 118, a lower chamber wall 120, an upper window 122, and a lower window 124 that cooperatively define the processing chamber 104. The upper window 122 is connected to the upper chamber wall 118, and the lower window 124 is connected to the lower chamber wall 120. A susceptor 126 is disposed within the processing chamber 104, and is configured to support the substrate 106 during a CVD process. The susceptor 126 is connected to a shaft 128, which is connected to a rotation mechanism (not shown) configured to rotate the shaft 128, the susceptor 126 and the substrate 106 about a rotational axis 130 extending in a vertical direction 132 of the CVD system 100.

The CVD system 100 also includes a plurality of heating elements 134 positioned above and below the processing chamber 104. The heating elements 134 are configured to provide thermal energy to the CVD reactor 102 to facilitate the CVD process. The heating elements 134 may include any suitable heating element that enables the CVD system 100 to function as described herein including, for example and without limitation, high-intensity radiant heat lamps, resistive heaters, and inductive heaters.

The upper chamber wall 118 and the lower chamber wall 120 each comprise a generally annular body made of, for example, stainless steel. In other embodiments, the upper chamber wall 118 and the lower chamber wall 120 may be made of metals other than stainless steel. The upper window 122 and the lower window 124 each comprise a generally annular body made of a transparent material, such as quartz, to allow radiant heat from the heating elements 134 to pass therethrough. The upper window 122 and the lower window 124 may be planar, or, as shown in FIG. 1, the upper window 122 and the lower window 124 may have a generally dome-shaped configuration. Alternatively, one or both of the upper window 122 and the lower window 124 may have an inwardly concave configuration.

The CVD reactor 102 also includes a plurality of liners and gas flow components configured to inhibit reactions between a process gas introduced into the CVD reactor 102 and the chamber walls 118, 120, and also to direct incoming gas into the processing chamber 104. In the example embodiment, the CVD reactor 102 includes an upper chamber liner 136, a lower chamber liner 138, an inject insert liner assembly 140, and a gas distribution plate assembly 142.

The upper chamber liner 136 and the lower chamber liner 138 are each disposed within the processing chamber 104 and adjacent one of the upper chamber wall 118 and the lower chamber wall 120. The upper chamber liner 136 extends circumferentially around the processing chamber 104 and covers inner surfaces of the upper chamber wall 118 to inhibit reactions between the upper chamber wall 118 and a process gas within the processing chamber 104. The lower chamber liner 138 extends circumferentially around the processing chamber 104 and covers inner surfaces of the lower chamber wall 120 to inhibit reactions between the lower chamber wall 120 and a process gas within the processing chamber 104. The upper chamber liner 136 and the lower chamber liner 138 are made of suitably non-reactive materials, such as quartz.

FIG. 2 is a perspective view of the CVD system 100 shown in FIG. 1, with a portion of the external housing 114 cut away to show the interior 116. Also, the upper and lower chamber walls 118, 120, and the upper and lower windows 122, 124 are omitted from FIG. 2 to show other features of the CVD system 100.

As shown in FIGS. 1 and 2, the upper chamber liner 136 and the lower chamber liner 138 cooperatively define a plurality of gas inlets 144 (one shown in FIG. 1) at an upstream end of the processing chamber 104 through which gas 110 from the gas injection system 108 is introduced into the processing chamber 104. The example embodiment includes 24 gas inlets 144, although other embodiments may include more or less than 24 gas inlets 144.

The inject insert liner assembly 140 includes two inject insert liners 146 disposed between the gas distribution plate assembly 142 and the gas inlets 144 defined by the upper and lower chamber liners 136, 138, and disposed between the upper chamber wall 118 and the lower chamber wall 120. An upstream end 148 of each of the inject insert liners 146 abuts the gas distribution plate assembly 142, and a downstream end 150 of each of the inject insert liners 146 abuts the upper and lower chamber liners 136, 138. Each of the inject insert liners 146 define a plurality of gas flow channels 152 (only one shown in FIG. 1) extending in a longitudinal direction 154 of the CVD system 100 from the upstream end 148 of the corresponding inject insert liner 146 to the downstream end 150 of the corresponding inject insert liner 146.

Figure 3:
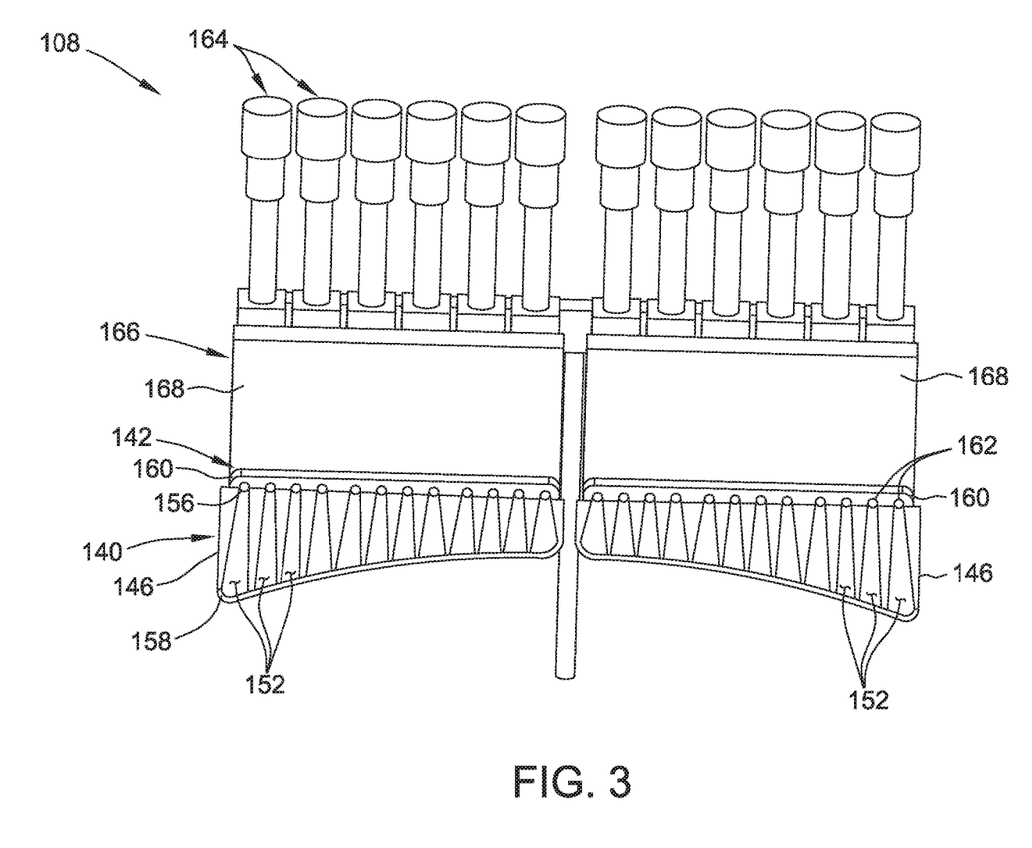
FIG. 3 is a perspective view of the gas injection system of FIG. 1 connected to an inject insert liner assembly and a gas distribution plate assembly of the substrate processing system of FIG. 1, with portions of the inject insert liner assembly omitted for clarity.

FIG. 3 is a perspective view of the gas injection system 108 connected to the inject insert liner assembly 140 and the gas distribution plate assembly 142. Portions of the inject insert liners 146 are cut away in FIG. 3 to show internal features of the inject insert liners 146. With additional reference to FIG. 3, each of the inject insert liners 146 of the example embodiment includes 12 gas flow channels 152, defining a total of 24 gas flow channels 152, where each of the gas flow channels 152 is connected in fluid communication with one of the 24 gas inlets 144 defined by the upper and lower chamber walls 118, 120. Other embodiments may include more or less than 24 gas flow channels 152, and may include a different number of gas flow channels 152 than the number of gas inlets 144.

Each gas flow channel 152 extends from a corresponding channel inlet 156 defined at the upstream end 148 of the inject insert liner 146 to a corresponding channel outlet 158 defined at the downstream end 150 of the inject insert liner 146. In the illustrated embodiment, each gas flow channel 152 is outwardly tapered from the upstream end 148 to the downstream end 150, as shown in FIGS. 1 and 3. That is, the cross-sectional area of each gas flow channel 152 gradually and continuously increases from the corresponding channel inlet 156 to the corresponding channel outlet 158. In other suitable embodiments, one or more gas flow channels 152 may be outwardly tapered along only a portion of the gas flow channel 152. In yet other suitable embodiments, one or more of the gas flow channels 152 may not be tapered. The outwardly tapered gas flow channels 152 of the inject insert liner assembly 140 allow incoming gas to gradually expand as the gas travels in the downstream direction, thereby reducing or eliminating negative effects associated with recirculation cells, and facilitating improving uniformity in gas flow distribution.

In the illustrated embodiment, the inject insert liner assembly 140 includes two inject insert liners 146, although other embodiments may include more or less than two inject insert liners 146. Some embodiments, for example, may include a single, unitary inject insert through which all incoming gas flowing into the CVD reactor 102 passes.

The gas distribution plate assembly 142 includes two gas distribution plates 160 disposed between the gas injection system 108 and the inject insert liner assembly 140. Each of the gas distribution plates 160 abuts one of the inject insert liners 146, and fluidly connects one of the inject insert liners 146 to the gas injection system 108. In particular, with reference to FIG. 3, each gas distribution plate 160 defines a plurality of holes 162 extending through a thickness of the gas distribution plate 160. Each of the holes 162 defined by the gas distribution plates 160 is fluidly connected to one of the channel inlets 156 corresponding to one of the gas flow channels 152 defined by the inject insert liners 146.

In the illustrated embodiment, each of the gas distribution plates includes 12 holes 162, defining a total of 24 holes, where each one of the holes 162 corresponds to one of the gas flow channels 152 defined by the inject insert liner assembly 140. In other suitable embodiments, the gas distribution plate assembly 142 may include more or less than 24 holes, and may include a different number of holes than the number of gas flow channels 152 defined by the inject insert liner assembly 140

In the illustrated embodiment, the gas distribution plate assembly 142 includes two gas distribution plates 160, although other embodiments may include more or less than two gas distribution plates 160. Some embodiments, for example, may include a single, unitary gas distribution plate through which all incoming gas flowing into the CVD reactor 102 passes.

The gas injection system 108 generally includes a plurality of gas flow controllers 164 and a gas injection cap assembly 166 connected in fluid communication between the plurality of gas flow controllers 164 and the gas distribution plates 160. The gas injection cap assembly 166 includes two, separate gas injection caps 168, each connected in fluid communication with a subset of the plurality of gas flow controllers 164. Other embodiments may include more or less than two gas injection caps 168. In some suitable embodiments, for example, the gas injection system 108 includes a single, unitary gas injection cap.

The two injection caps 168 are configured to feed gas into different portions of the CVD reactor 102, but are otherwise identical. Each of the gas injection caps 168 is connected in fluid communication between the plurality of gas flow controllers 164 and one of the gas distribution plates 160. Each of the gas injection caps 168 is disposed downstream from the gas flow controllers 164, and is configured to direct gas from the gas flow controllers 164 to the gas injection port 112 of the CVD reactor 102. As shown in FIG. 1, the gas injection caps 168 sealingly engage a portion of the chamber walls 118, 120 to provide a fluid tight seal.

Each of the gas injection caps 168 defines a plurality of gas flow passages 170 therein, one of which is shown in FIG. 1. Each of the gas flow controllers 164 is connected in fluid communication with at least one of the gas flow passages 170, and is configured to control the flow rate of gas flowing into and through the corresponding gas flow passage(s) 170. In the illustrated embodiment, each gas flow controller 164 is connected in fluid communication with a single gas flow passage 170, and is configured to control the flow rate of gas through a single gas flow passage 170. In other embodiments, a single gas flow controller 164 may be connected in fluid communication with more than one of the gas flow passages 170 and configured to control the gas flow rate through more than one of the gas flow passages 170.

The gas flow controllers 164 are connected in fluid communication with a gas supply source (e.g., a gas tank) via a gas supply line 172 and a manifold 174, and are configured to control the rate of gas flowing into the gas injection caps 168. The gas supply source may include any one or combination of known process gases used in chemical vapor deposition processes, including, for example and without limitation, hydrogen, tricholorosilane, and diborane. Silicon precursors other than tricholorosilane may also be used with the embodiments described herein, including dichlorosilane, silane, trisilane, tetrachlorosilane, methylsilane, pentasilane, neopentasilane, and other higher order silane precursors. Precursors other than silicon precursors may also be used with the embodiments described herein, including germane, digermane, and other germanium precursors. Dopant gas species other than diborane may be used, including phosphine and arsine.

As shown in FIG. 1, each gas flow controller 164 includes an inlet 176 connected to the manifold 174, and an outlet 178 connected to one of the gas injection caps 168. Each gas flow controller 164 is configured to control the flow rate of gas flowing through the gas flow controller 164 from the inlet 176 to the outlet 178. The gas flow controllers 164 may include any suitable device for regulating the flow rate of gas passing through the gas flow controllers 164 including, for example and without limitation, mass flow controllers, volumetric flow controllers, throttle valves, butterfly valves, and combinations thereof. The gas flow controllers 164 may be automated or manually actuated. Automated flow controllers may be controlled by one or more processors or computing devices (not shown) capable of adjusting the flow rate of gas through a gas flow controller based on a user input or one or more pre-defined settings or conditions. The gas flow controllers 164 shown in FIG. 1 are manually actuated gas flow controllers, each including a manually actuatable knob 180 that enables the maximum flow rate through the corresponding gas flow controller 164 to be increased or decreased by rotating the knob 180.

As noted above, the CVD reactor 102 and the gas injection system 108 are enclosed within the interior 116 of the external housing 114. As shown in FIG. 2, the external housing 114 includes a plurality of sidewalls 182 and an access door 184 hingedly connected to one of the sidewalls 182. The access door 184 provides access to the interior 116 of the external housing 114 such that a user of the CVD system 100 can access the CVD reactor 102 and the gas injection system 108 while they are positioned within the interior 116 of the external housing 114. The external housing 114 may also include one or more viewing windows (not shown) to enable visual inspection of the CVD reactor 102 and the gas injection system 108 during operation.

The external housing 114 is constructed so as to limit or minimize the overall size of the CVD system 100. For example, the external housing 114 is sized and shaped to minimize excess spacing between the sidewalls 182 of the external housing 114 and other components of the CVD system 100, such as the gas injection system 108.

In operation, a substrate to be processed is positioned within the processing chamber 104 on the susceptor 126, and the processing chamber 104 is sealed. One or more process gases 110 are fed into the processing chamber 104 through the gas injection system 108, and the flow rate of gas flowing into the processing chamber 104 through the gas inlets 144 is controlled using the gas flow controllers 164.

As described in more detail herein, the gas injection systems of the present disclosure provide improved uniformity of gas flow distribution and enhanced precision with which gas flow rates within CVD reactors can be controlled as compared to conventional CVD systems. Moreover, the gas injection systems described herein provide these benefits without requiring modification of the external housing or other components of existing CVD systems.

Figure 4:
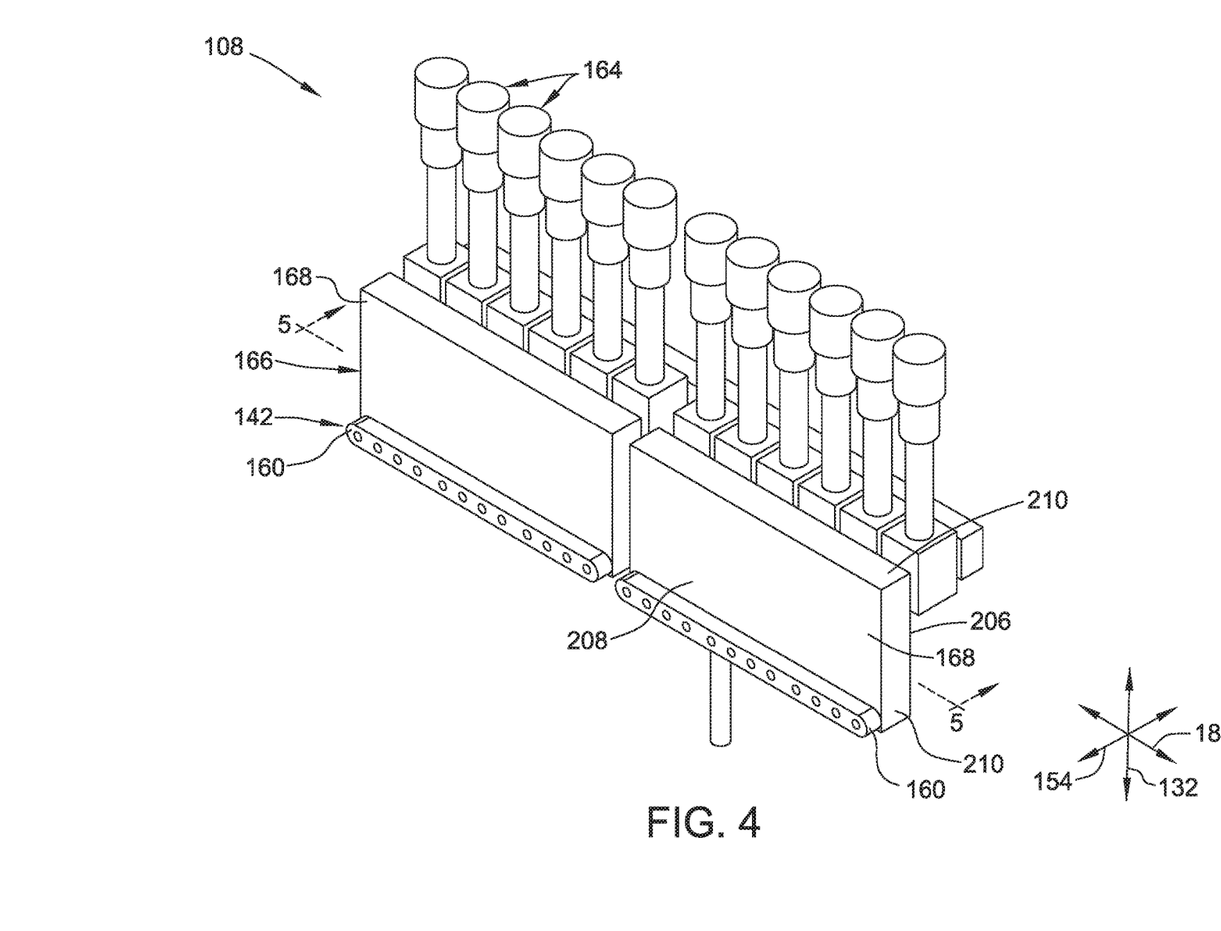
FIG. 4 is another perspective view of the gas injection system of FIG. 1 connected to the gas distribution plate assembly of FIG. 1.
Figure 5:
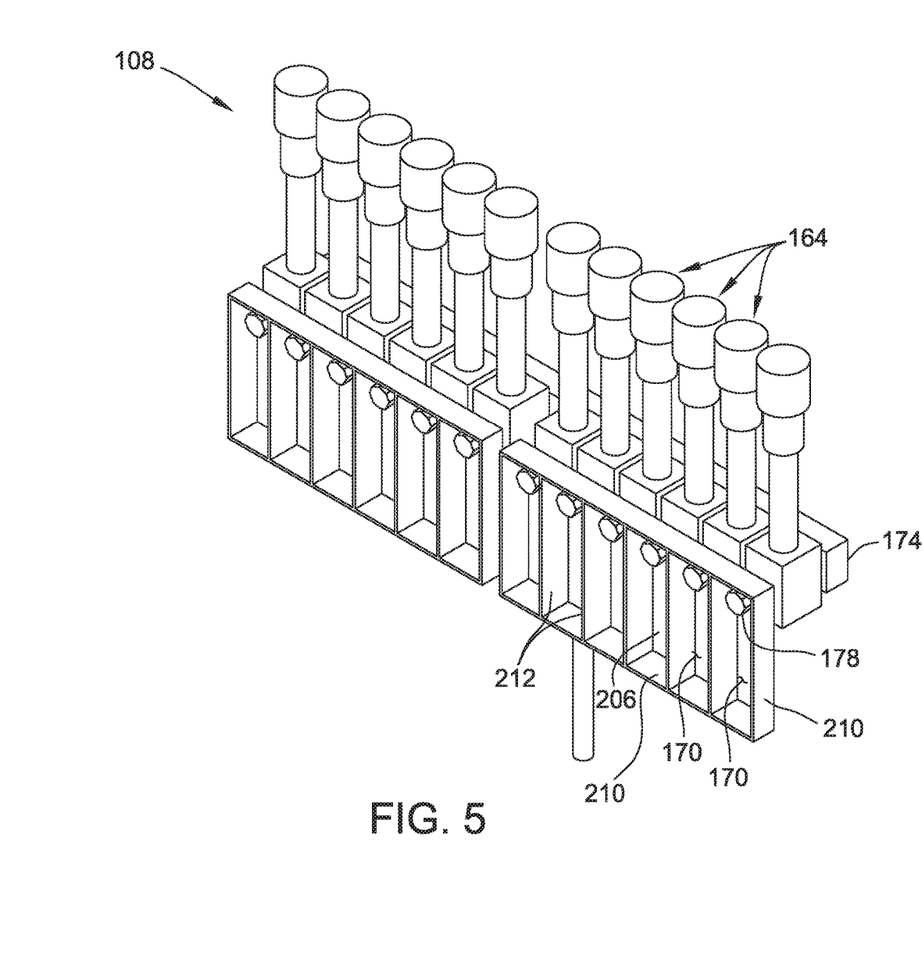
FIG. 5 is a cross-section of the gas injection system of FIG. 4 taken along line 5-5 in FIG. 4.
Figure 6:
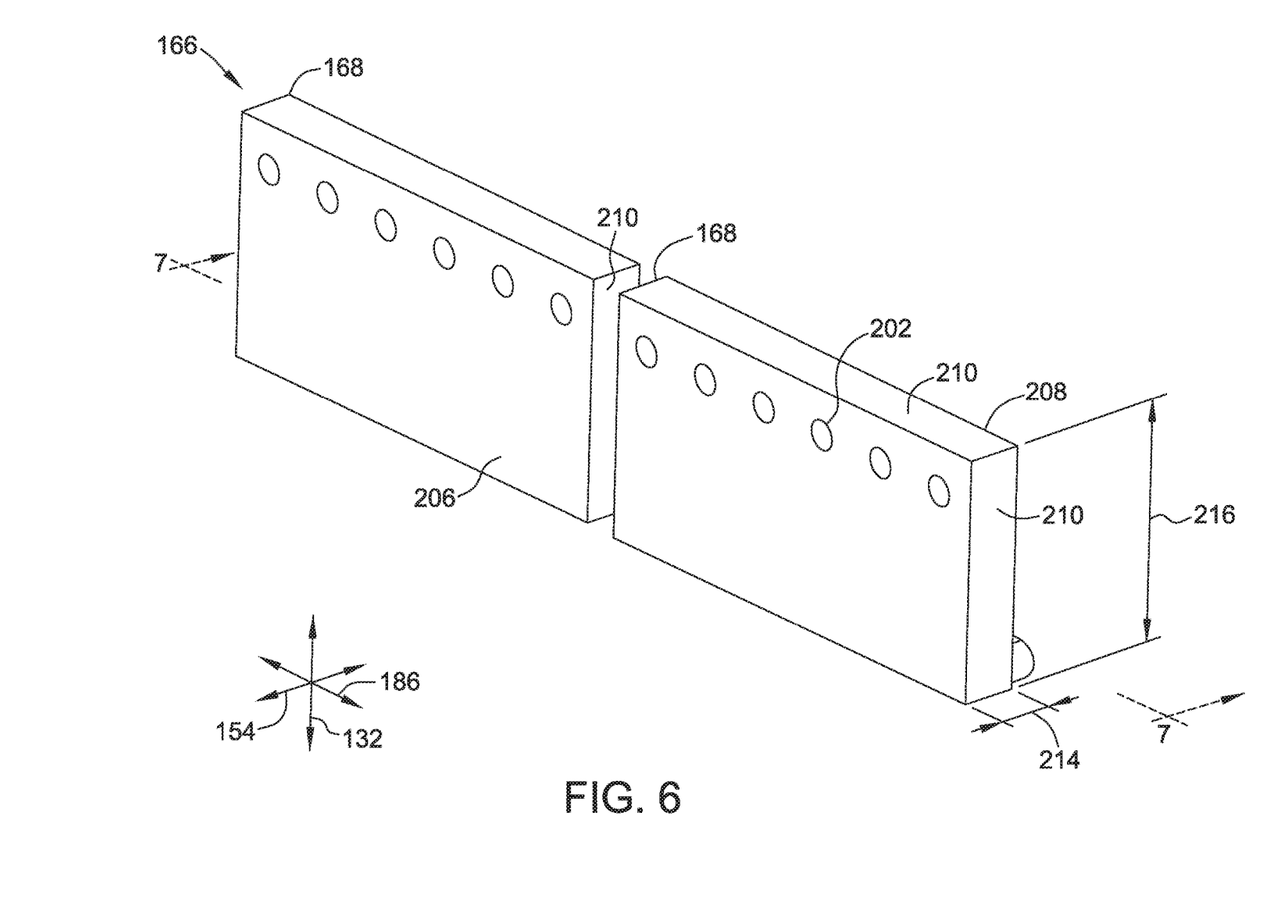
FIG. 6 is a perspective view of the upstream side of a gas injection cap assembly of the gas injection system of FIG. 4.
Figure 7:
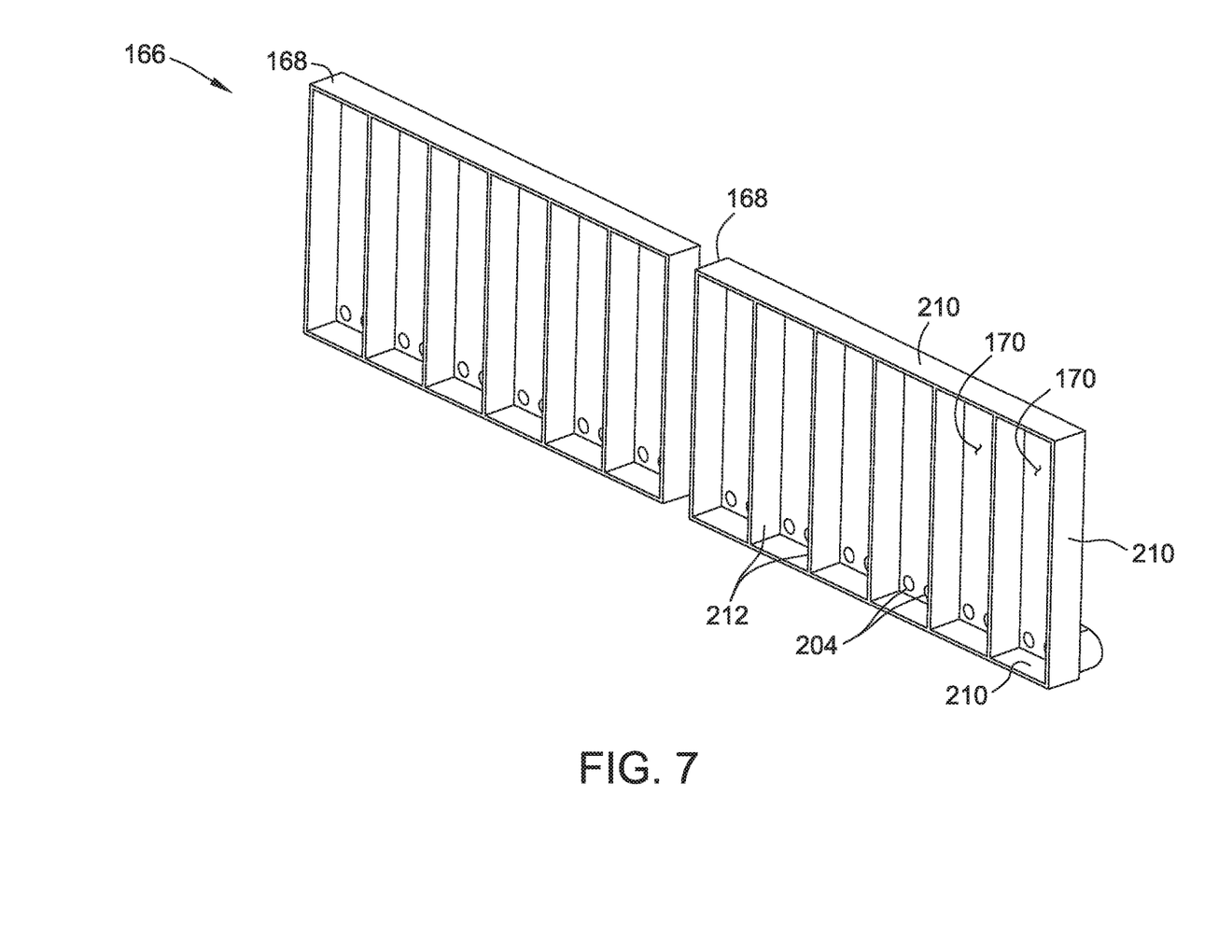
FIG. 7 is a cross-section of the gas injection cap assembly of FIG. 6 taken along line 7-7 in FIG. 6.

FIG. 4 is a perspective view of the gas injection system 108 connected to the gas distribution plate assembly 142. FIG. 5 is a cross-section of the gas injection system 108 taken along line 5-5 in FIG. 4. FIG. 6 is a perspective view of an upstream side of the gas injection cap assembly 166, and FIG. 7 is a cross-section of the gas injection cap assembly 166 taken along line 7-7 in FIG. 6.

Referring to FIGS. 4-7, each injection cap 168 has a plurality of gas flow passages 170 defined therein. In the illustrated embodiment, each injection cap 168 includes 6 gas flow passages 170, defining a total of 12 gas flow passages 170 in the gas injection cap assembly 166. In other embodiments, one or both of the gas injection caps 168 may have more or less than 6 gas flow passages defined therein.

Each injection cap 168 defines at least one gas inlet 202 for each of the gas flow passages 170, and at least one gas outlet 204 for each of the gas flow passages 170. Each of the gas flow passages 170 extends from a corresponding gas inlet 202 to a corresponding gas outlet 204. Each gas outlet 204 is connected in fluid communication with one of the holes 162 of the gas distribution plate 160, which is in turn connected in fluid communication with at least one of the gas flow channels 152 defined within the inject insert liner assembly 140.

In the illustrated embodiment, each injection cap 168 defines one gas inlet 202 for each of the gas flow passages 170, and two gas outlets 204 for each of the gas flow passages 170. Thus, in the illustrated embodiment, each gas flow passage 170 is connected in fluid communication with two holes 162 in the gas distribution plate 160, and supplies gas to two of the holes 162 in the gas distribution plate 160. Moreover, in the illustrated embodiment, each of the gas flow passages 170 supplies gas to two of the gas flow channels 152 within the inject insert liner assembly 140 and two of the gas inlets 144 defined by the upper and lower chamber liners 136, 138. In other embodiments, the gas flow passages 170 may be configured to supply gas to more or less than two of the holes 162 in the gas distribution plate 160, more or less than two of the gas flow channels 152 within the inject insert liner assembly 140, and/or more or less than two of the gas inlets 144 defined by the upper and lower chamber liners 136, 138.

In the example embodiment, each of the gas flow controllers 164 is connected in fluid communication with one of the gas flow passages 170. Thus, in the example embodiment, each gas flow controller 164 is configured to control the rate of gas flow through one of the gas flow passages 170, through two of the holes 162 in the gas distribution plate 160, through two of the gas flow channels 152 in the inject insert liner assembly 140, and through two of the gas inlets 144 defined by the upper and lower chamber liners 136, 138.

In other embodiments, the gas flow controllers 164 may be configured to control the gas flow rate through more than one of the gas flow passages 170, through more or less than two holes in the gas distribution plate 160, through more or less than two gas flow channels 152 in the inject insert liner assembly 140, and/or through more or less than two gas inlets 144 defined by the upper and lower chamber liners 136, 138. In some embodiments, the gas injection system 108 may be configured such that at least some of the gas flow controllers 164 control the flow rate through a single gas flow channel 152 in the inject insert liner assembly 140 and a single gas inlet 144. In some embodiments, for example, at least one of the gas flow passages 170 has a single gas outlet 204 connected in fluid communication with a single gas flow channel 152 in the inject insert liner assembly 140, which is connected to a single gas inlet 144 defined by the upper and lower chamber liners 136, 138.

The configuration and arrangement of the gas injection cap assembly 166 facilitates improving precise control of gas flow rates and uniformity within the gas injection caps 168 and within the CVD reactor 102. In particular, the size, shape, and position of the gas injection caps 168 relative to the gas flow controllers 164 enable multiple gas flow controllers 164 to be positioned within the interior 116 of the external housing 114, and in close proximity to the gas injection caps 168. As a result, the amount of piping or conduit between the gas flow controllers 164 and the processing chamber 104 is reduced as compared to known substrate processing systems, thereby improving the precision with which gas flow rates can be controlled.

In the example embodiment, each gas injection cap 168 has a generally cuboidal configuration, including an upstream wall 206, a downstream wall 208, and a plurality of sidewalls 210 extending from the upstream wall 206 to the downstream wall 208. Each injection cap 168 also includes a plurality of partition walls 212 separating adjacent gas flow passages 170 from one another. In the illustrated embodiment, each injection cap 168 includes five partition walls at least partially defining six gas flow passages 170. In other suitable embodiments, the injection caps 168 may include more than or less than five partition walls 212, such as one, two, three, four, six, eight, or even more partition walls.

Each partition wall 212 is substantially planar, and is oriented substantially parallel to the other partition walls 212 within the same injection cap 168. In the illustrated embodiment, each partition wall 212 is oriented in a generally vertical orientation. In other embodiments, one or more partition walls 212 may be oriented in an orientation other than substantially vertical.

As shown in FIG. 6, each injection cap 168 has a length 214 extending in the longitudinal direction 154 of the CVD system 100 from the upstream wall 206 to the downstream wall 208, and a height 216 extending in the vertical direction 132 of the CVD system 100 from one of the sidewalls 210 to another one of the sidewalls 210 positioned on a vertically opposite side of the injection cap 168. The height 216 of each injection cap 168 is generally greater than the corresponding length 214. The injection caps 168 may have any suitable length 214 and height 216 that enables the gas injection system 108 to function as described herein. In some embodiments, each of the gas injection caps 168, and the gas injection cap assembly 166, has a length 214 of between about 2 centimeters (cm) and about 3 cm, and more suitably between about 2 cm and about 2.5 cm. Moreover, in some embodiments, each of the gas injection caps 168, and the gas injection cap assembly 166, has a height 216 of between about 8 cm and about 12 cm, and more suitably between about 8 cm and about 9 cm. In the example embodiment, each of the gas injection caps 168, and the gas injection cap assembly 166, has a length 214 of about 2 cm, and a height 216 of about 8.6 cm.

The configuration of the injection caps 168 (e.g., the size and shape of the injection caps 168) enables multiple gas flow controllers 164 to be positioned within the interior 116 of the external housing 114, and in close proximity to the gas injection caps 168. For example, the length 214 of each of the gas injection caps 168 is reduced as compared to known gas injection caps. As a result, multiple gas flow controllers 164 can be positioned within the interior 116 of the external housing 114 (e.g., between one of the sidewalls 182 of the external housing 114 (FIG. 2) and the gas injection cap assembly 166), and in close proximity to the gas injection cap assembly 166. Moreover, the height 216 of the gas injection caps 168 is increased as compared to known gas injection caps 168 to compensate for the reduced length 214 of the gas injection caps 168 and to provide a suitable flow length of the gas flow passages 170.

As shown in FIG. 5, the gas flow passages 170 are generally elongate in the vertical direction 132 as a result of the size and shape of the injection caps 168. That is, each gas flow passage 170 is longer in the vertical direction 132 than in the longitudinal direction 154 and the transverse direction 186 of the CVD system 100.

As noted above, each of the gas flow controllers is disposed within the interior 116 of the external housing 114, and in close proximity (i.e., proximate) to the gas injection cap assembly 166 and the CVD reactor 102. In the example embodiment, each of the gas flow controllers 164 is positioned immediately adjacent to one of the gas injection caps 168, and is directly connected to one of the gas injection caps 168. As shown in FIG. 5, for example, the outlet 178 of each of the gas flow controllers 164 is directly connected to and extends through the gas inlet 202 of one of the gas flow passages 170. The proximity between the gas flow controllers 164, the injection caps 168, and the CVD reactor 102 enhances the precision with which the gas flow rates can be controlled by reducing excess conduit between the gas flow controllers 164 and the processing chamber 104.

Additionally, the configuration of the gas injection system 108 provides an increased ability to tune the gas flow rate distribution of gas flowing into the processing chamber 104. For example, the gas injection system 108 enables a greater number of gas flow controllers 164 to be connected in close proximity to the gas injection caps 168 per the number of gas flow channels 152 and gas inlets 144 as compared to known CVD systems. In the illustrated embodiment, for example, each of the gas flow controllers 164 controls the gas flow rate through one of the gas flow passages 170 and through two of the gas flow channels 152 and gas inlets 144. Thus, the gas injection system 108 of the present disclosure enables independent control of the gas flow rate through twelve different gas inlet zones of the processing chamber 104, where each gas inlet zone includes two of the gas inlets 144.

In other embodiments, one or more gas flow controllers 164 may be configured to control the flow rate through more or less than two gas flow channels 152 and two gas inlets 144. In yet other embodiments, the gas injection system 108 may be configured to provide independent control of the gas flow rate through more or less than twelve different gas inlet zones of the processing chamber 104.

Figure 8:
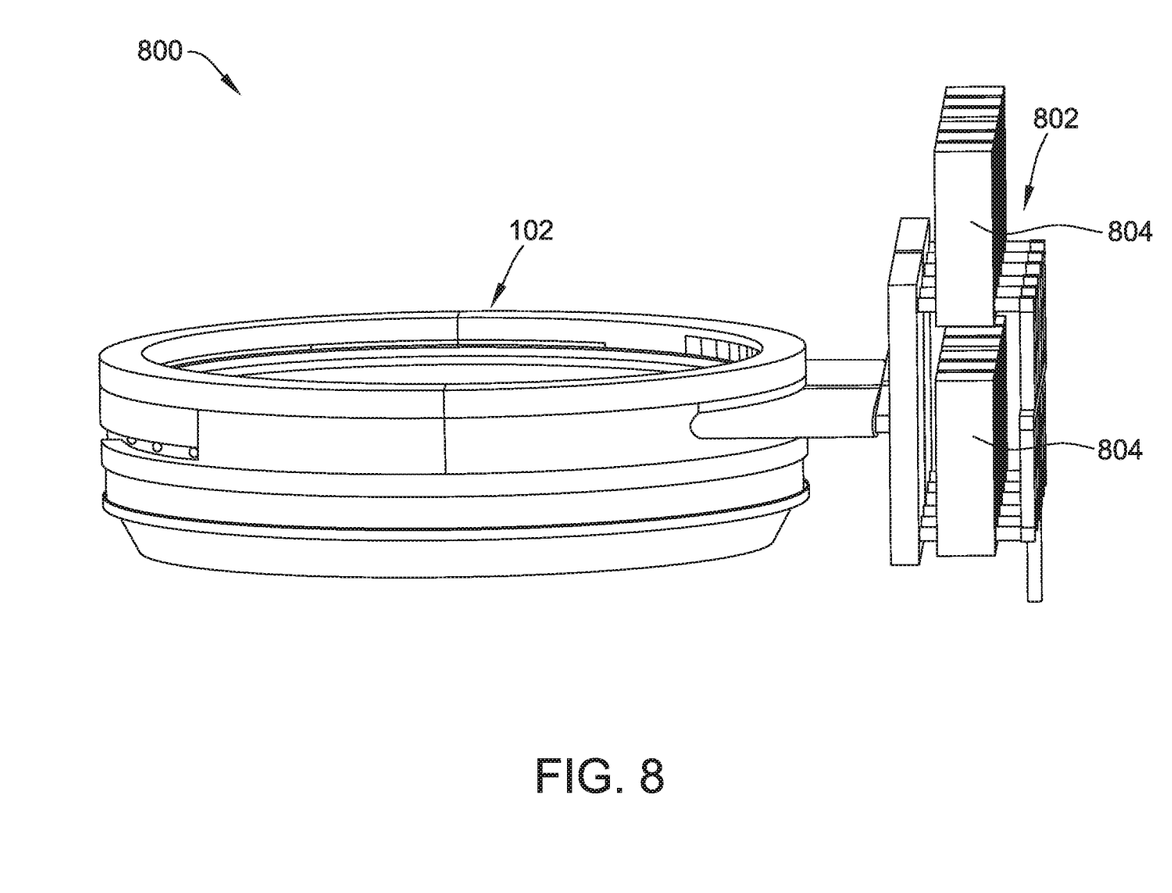
FIG. 8 is a perspective view of another suitable embodiment of a substrate processing system including a gas injection system with automated gas flow controllers.
Figure 9:
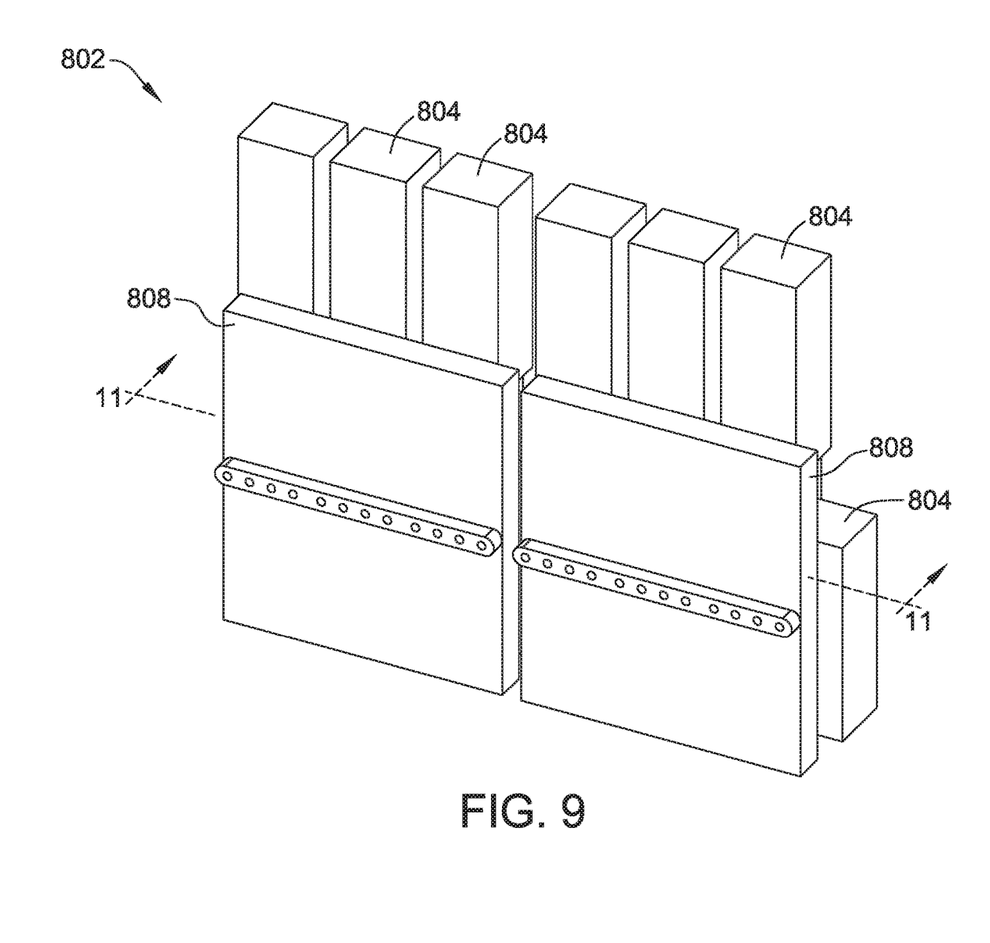
FIG. 9 is a perspective view of the downstream side of the gas injection system of FIG. 8.
Figure 10:
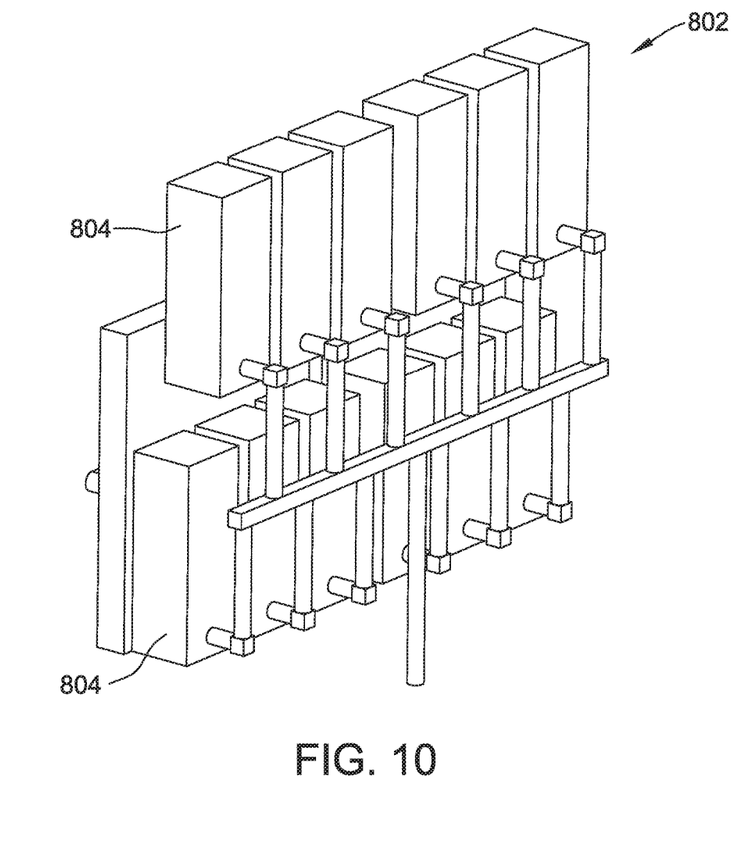
FIG. 10 is a perspective view of the upstream side of the gas injection system of FIG. 8.
Figure 11:
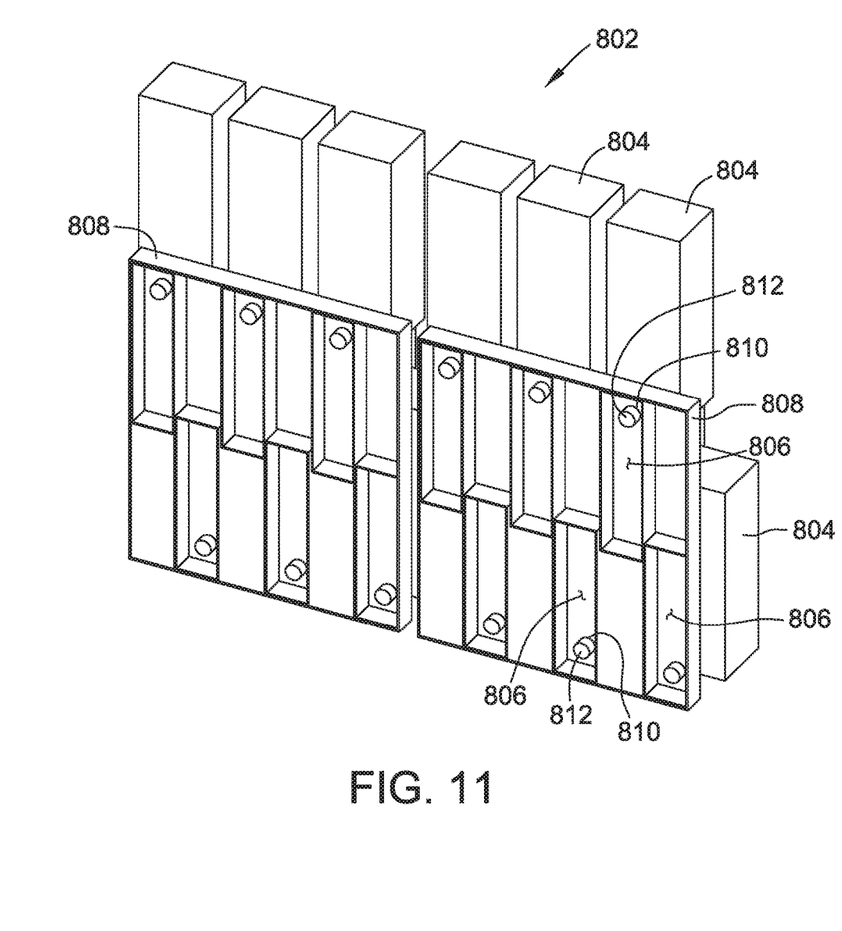
FIG. 11 is a cross-section of the gas injection system of FIG. 8 taken along line 11-11 in FIG. 9.

FIG. 8 is a perspective view another suitable embodiment of a substrate processing system shown in the form of a CVD system 800 including a gas injection system 802 with automated gas flow controllers 804. FIGS. 9 and 10 are perspective views of the downstream and upstream sides, respectively, of the gas injection system 802, and FIG. 11 is a cross-section of the gas injection system 802 taken along line 11-11 in FIG. 9. The CVD system 800 shown in FIG. 8 is identical to the CVD system 100 shown in FIG. 1, except the gas injection system 802 is designed to accommodate the generally larger automated gas flow controllers 804 within the interior 116 of the external housing 114 (not shown in FIG. 8). As shown in FIGS. 8-11, for example, the gas flow controllers 804 are arranged in two horizontal rows positioned vertically above and below one another. Additionally, as shown in FIG. 11, gas flow passages 806 defined within gas injection caps 808 are also arranged in two horizontal rows positioned vertically above and below one another. The inlets 810 of adjacent gas flow passages 806 are disposed at vertically opposite ends of the gas injection caps 808 to receive an outlet 812 of one of the automated gas flow controllers 804. The configuration of the gas injection caps 808 and the arrangement of the automated gas flow controllers 804 enable the automated gas flow controllers 804 to be positioned within the interior 116 of the external housing 114 (FIGS. 1 and 2), and in close proximity to the gas injection caps 808 and CVD reactor 102.

The embodiments described herein are suited for processing semiconductor or solar-grade wafers, though may be used in other applications. The embodiments described herein are particularly suited for use in atmospheric-pressure silicon on silicon chemical vapor deposition epitaxy using gas mixtures including hydrogen, tricholorosilane, and diborane. Silicon precursors other than tricholorosilane may also be used with the embodiments described herein, including dichlorosilane, silane, trisilane, tetrachlorosilane, methylsilane, pentasilane, neopentasilane, and other higher order silane precursors. Precursors other than silicon precursors may also be used with the embodiments described herein, including germane, digermane, and other germanium precursors. Dopant gas species other than diborane may be used, including phosphine and arsine. The embodiments described herein may also be used in processes other than atmospheric-pressure silicon on silicon epitaxy, including reduced-pressure epitaxy (e.g., at pressures between about 10 Torr and about 750 Torr), silicon-germanium epitaxy, carbon-doped silicon epitaxy, and non-epitaxial chemical vapor deposition. The embodiments described herein may also be used to process wafers other than silicon wafers, including germanium wafers, gallium arsenide wafers, indium phosphide wafers, and silicon carbide wafers.

Embodiments of the substrate processing systems and gas injection systems described herein provide several advantages over known substrate processing systems. For example, embodiments of the substrate processing systems and gas injection systems described herein provide multiple gas flow controllers connected in close proximity to gas injection caps, thereby enabling the gas flow distribution within the processing chamber to be easily tuned. Moreover, the design of injection caps described herein enable multiple gas flow controllers to be positioned in close proximity to the injection caps and the processing chamber, thereby reducing the effective length of the flow path between the gas flow controllers and the gas inlets of the processing chamber as compared to conventional substrate processing systems. By reducing the effective length of the flow path between the flow controllers and the gas inlets of the processing chamber, embodiments of substrate processing systems and gas injection systems of the present disclosure provide improved precision over the control of gas flow rates within the processing chamber.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for depositing a layer on a substrate positioned on a susceptor, the system comprising:
    a processing chamber including a gas inlet disposed at an upstream end of the processing chamber;
    an external housing defining an interior and configured to enclose the reactor within the interior of the external housing, the external housing including an access door;
    a plurality of gas flow controllers connected in fluid communication with a gas supply source, the plurality of gas flow controllers including at least three gas flow controllers;
    a gas distribution plate disposed between the plurality of gas flow controllers and the gas inlet, the gas distribution plate defining a plurality of holes;
    a gas injection cap connected in fluid communication between the plurality of gas flow controllers and the gas distribution plate, the gas injection cap defining a plurality of gas flow passages each extending from an inlet connected to one of the gas flow controllers to an outlet connected in fluid communication with at least one of the holes in the gas distribution plate, wherein each of the gas flow controllers is disposed proximate to the gas injection cap; and
    an inject insert liner disposed between the gas distribution plate and the gas inlet of the processing chamber, the inject insert liner defining a plurality of gas flow channels therein, each gas flow channel connected in fluid communication with one of the holes in the gas distribution plate.

2. The system of claim 1, wherein each of the gas flow controllers is disposed immediately adjacent to the gas injection cap.

3. The system of claim 1, wherein each of the gas flow controllers is directly connected to the gas injection cap.

4. The system of claim 1, wherein each of the gas flow controllers includes an inlet and an outlet, wherein the outlet of each of the gas flow controllers is directly connected to the inlet of one of the gas flow passages.

5. The system of claim 1, wherein each of the gas flow passages is in fluid communication with no more than two of the holes defined by the gas distribution plate.

6. The system of claim 1, wherein each of the gas flow controllers is configured to control the gas flow rate through no more than two of the holes defined by the gas distribution plate.

7. The system of claim 1, wherein at least one of the gas flow controllers is a manually actuated flow controller.

8. The system of claim 1, wherein at least one of the gas flow controllers is an automated flow controller.

9. The system of claim 1, wherein each of the gas flow controllers is configured to control the gas flow rate through no more than two of the gas flow channels defined by the inject insert liner.

10. The system of claim 1, wherein each of the gas flow channels extends from a channel inlet defined at an upstream end of the inject insert liner to a channel outlet defined at a downstream end of the inject insert liner, at least one of the gas flow channels being outwardly tapered from the channel inlet to the channel outlet.

11. The system of claim 1, wherein the plurality of gas flow controllers includes at least six gas flow controllers.

12. A system for depositing a layer on a substrate, the system comprising:
    an external housing defining an interior and including an access door configured to provide access to the interior of the external housing;
    a reactor defining a processing chamber disposed within the interior and including a gas inlet disposed at an upstream end of the processing chamber, the reactor positioned within the interior of the external housing;
    a susceptor disposed within the processing chamber and configured to support the substrate;
    a plurality of gas flow controllers connected in fluid communication with a gas supply source;
    a gas distribution plate disposed between the plurality of gas flow controllers and the gas inlet, the gas distribution plate defining a plurality of holes;
    a gas injection cap connected in fluid communication between the plurality of gas flow controllers and the gas distribution plate, the gas injection cap defining a plurality of gas flow passages each extending from an inlet connected to one of the gas flow controllers to an outlet connected in fluid communication with at least one of the holes in the gas distribution plate, wherein the plurality of gas flow controllers and the gas injection cap are enclosed within the interior of the external housing; and
    an inject insert liner disposed between the gas distribution plate and the gas inlet of the processing chamber, the inject insert liner defining a plurality of gas flow channels therein, each gas flow channel connected in fluid communication with one of the holes in the gas distribution plate.

13. The system of claim 12, wherein each of the gas flow controllers is directly connected to the gas injection cap.

14. The system of claim 12, wherein each of the gas flow passages is in fluid communication with no more than two of the holes defined by the gas distribution plate.

15. The system of claim 12, wherein each of the gas flow controllers is configured to control the gas flow rate through no more than two of the holes defined by the gas distribution plate.

16. The system of claim 12, wherein each of the gas flow controllers is configured to control the gas flow rate through no more than two of the gas flow channels defined by the inject insert liner.

17. The system of claim 12, wherein the plurality of gas flow controllers includes at least three gas flow controllers.

* * * * *